(12) United States Patent
Johnson et al.

(10) Patent No.: US 6,850,333 B1
(45) Date of Patent: Feb. 1, 2005

(54) OPTIMIZED APERTURE SHAPE FOR OPTICAL CD/PROFILE METROLOGY

(75) Inventors: Kenneth C. Johnson, Santa Clara, CA (US); Fred E. Stanke, Cupertino, CA (US)

(73) Assignee: Therma-Wave, Inc., Fremont, CA (US)

( * ) Notice: Subject to any disclaimer, the term of this patent is extended or adjusted under 35 U.S.C. 154(b) by 175 days.

(21) Appl. No.: 09/938,415

(22) Filed: Aug. 23, 2001

Related U.S. Application Data

(60) Provisional application No. 60/227,739, filed on Aug. 24, 2000.

(51) Int. Cl.[7] .......................... G01B 11/14; G01B 11/04; G01B 11/08; G01N 21/00
(52) U.S. Cl. ................ 356/625; 356/237.4; 356/237.5; 356/237.2; 356/636
(58) Field of Search ........................... 356/237.2, 237.4, 356/237.5, 625, 630, 632, 635, 636, 601, 600

(56) References Cited

U.S. PATENT DOCUMENTS

| | | | |
|---|---|---|---|
| 5,867,276 A | | 2/1999 | McNeil et al. ............... 356/445 |
| 5,963,329 A | | 10/1999 | Conrad et al. ............... 356/372 |
| 6,011,624 A | * | 1/2000 | de Groot ..................... 356/511 |
| 6,067,162 A | * | 5/2000 | Hagen et al. ................ 356/600 |
| 6,081,325 A | * | 6/2000 | Leslie et al. ............. 356/237.2 |
| 6,215,551 B1 | * | 4/2001 | Nikoonahad et al. .... 356/237.2 |
| 6,256,100 B1 | * | 7/2001 | Banet et al. ................. 356/432 |
| 6,307,635 B1 | * | 10/2001 | Goldberg ..................... 356/521 |
| 6,356,399 B1 | * | 3/2002 | Haga et al. .................. 359/800 |
| 6,426,502 B1 | * | 7/2002 | Finarov ....................... 250/348 |
| 6,654,131 B2 | * | 11/2003 | Opsal et al. ................. 356/625 |

OTHER PUBLICATIONS

J. Allgair et al., "Manufacturing Considerations for Implementation of Scatterometry for Process Monitoring," In *Metrology, Inspection, and Process Control for Microlithography XIV. Proceedings of SPIE*, vol. 3998 (2000), pp. 135–134.

J.Bao et al., "Specular Spectral Profilometry on Metal Layers," In *Metrology, Inspection, and Process Control for Microlithography XIV, Proceedings of SPIE*, vol. 3998 (2000), pp. 882–892.

* cited by examiner

*Primary Examiner*—Judy Nguyen
*Assistant Examiner*—Andrew Sever
(74) *Attorney, Agent, or Firm*—Stallman & Pollock LLP

(57) ABSTRACT

A metrology instrument for measuring grating-like microstructures on a sample for parameters of interest is characterized by an illumination spot that is elongated. The elongated illumination spot is produced by providing the designing the illumination optics to have a limiting aperture that is also elongated. The limiting aperture and corresponding illumination spot will have respective long directions that are perpendicular to each other. The sample is supported in a measurement relation to the instrument wherein the illumination spot is oriented generally transverse to linear elements of a microstructure. The microstructure can be also be a two-dimensional bigrating, with the illumination spot on a row or column of the bigrating.

16 Claims, 3 Drawing Sheets

OPTIMIZED APERTURE SHAPE FOR OPTICAL CD/PROFILE METROLOGY

CROSS-REFERENCE TO RELATED APPLICATION

This application claims priority from U.S. provisional application No. 60/227,739, filed Aug. 24, 2000.

TECHNICAL FIELD

The invention relates to optical measuring instruments for samples containing grating-like features, and in particular for determining critical dimensions (line width, etc.), profile or shape, and similar parameters of interest of the grating-like features. The invention relates especially to elements of such instruments for providing a specified illumination of the sample features.

BACKGROUND ART

Optical scatterometry, reflectometry, or ellipsometry methods can be used to measure grating profile shapes and critical dimensions that are significantly smaller than the measurement instrument's optical wavelength(s) and imaging resolution. With this technique, a grating sample's reflectivity in one or more diffracted orders (typically the zero order) is measured at multiple wavelengths, incidence angles, and/or polarization states, and a theoretical electromagnetic scattering model is fit to the measured data to determine grating parameters such as profile shape and line width. For example, FIG. 1 schematically illustrates reflectometer-type measurement instrument that can be used for grating measurement. Illumination from a source 101 transmits through a beam splitter 102, and is focused by an objective lens 103 onto a small focus spot 104 on a grating sample 105. Reflected radiation is diverted by beam splitter 102 toward a radiation-sensing detector 106. Reflectivity data is acquired over a range of wavelengths and is computationally processed to determine grating parameters such as line width, thickness, etc. The illumination system in FIG. 1 has a limiting aperture 107 whose size and shape determines the size and shape of the diffraction-limited focus spot 104 on grating 105. Typically, the focus spot must be large enough to cover multiple grating lines to achieve good measurement sensitivity. But if the grating is close to adjoining structures a large spot size may result in degraded measurement performance due to proximity effects. This tradeoff is illustrated in FIGS. 2A and 2B. These figures show a plan view of grating 105 comprising grating lines 201a, 201b, etc. of limited length. (The grating lines may actually be much longer, but the useful area for measurement may be limited due to other structures overlying or underlying the grating.) The limiting aperture, illustrated as circle 107, controls the size and shape of the focus spot 104. A large aperture results in a small focus spot which does not cover sufficiently many grating lines to achieve good measurement sensitivity (FIG. 2A). A small aperture results in a large focus spot covering many grating lines (FIG. 2B), but in this case the focus spot extends outside of the measurable grating region 105, resulting in degraded measurement performance.

DISCLOSURE OF THE INVENTION

The invention alters the prior optical metrology instrument to eliminate the undesirable tradeoff by providing the instrument with an elongate limiting aperture. An illumination source directs light along an illumination path. An elongated pupil aperture is located in that illumination path. An objective lens focuses the light received from the aperture to the sample. The elongated pupil aperture and the objective lens together define an elongated illumination spot on the sample, wherein the aperture and illumination have respective long directions that are perpendicular to each other. When measuring grating-like microstructures on a sample, the sample is supported in a measurement relation to the instrument such that the illumination spot is oriented generally transverse to the linear elements of those microstructures.

The objective is preferably characterized by a low numerical aperture so as to produce focused illumination that has only a narrow range of incidence angles in the direction that is generally transverse to the linear elements of the microstructure.

The illuminated sample produces a characteristic optical signature, such as a reflected intensity spectrum, that is indicative of parameters of interest of the microstructure. The instrument has collection and detection optics to measure the optical signature for subsequent processing. For example, the processor may determine a best fit of the detected signature to a theoretical signature corresponding to a specific set of values for the parameters of interest.

The grating-like structure can also be a two-dimensional bigrating, in which case the illuminated spot may correspond to a row or column of the bigrating.

BEST MODE OF CARRYING OUT THE INVENTION

Figure 3:
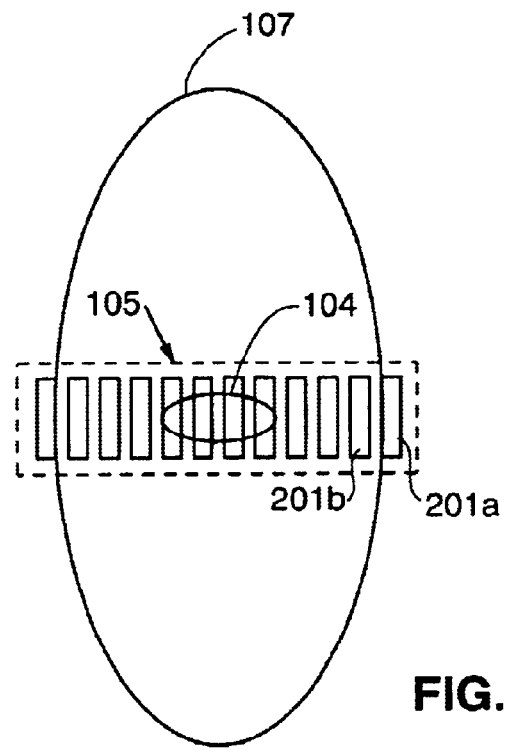
FIGS. 3 and 4 are top schematic views of elongated illumination spots produced over grating and bigrating structures on a sample by instruments like that in FIG. 1 with elongated limiting apertures according to the present invention.
Figure 4:
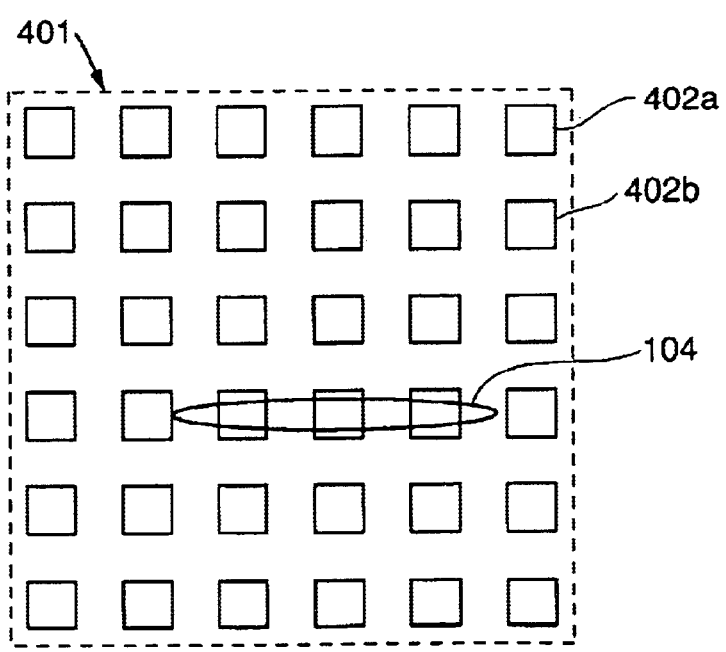

FIG. 3 illustrates the method of the present invention which circumvents the spot size tradeoff. Again, FIG. 3 shows a plan view of the grating 105, limiting aperture 107, and focus spot 104. The aperture has an asymmetric, elongated shape (elliptical in this example, although it could alternative be rectangular or could have some other optimal shape). The spot size is consequently elongated along the transverse direction so that it extends over many grating lines, but stays confined within the grating region 105. The aperture size and shape could be variable so that it can be independently optimized for different grating geometries. This method would be useful for applications where the usable measurement area is limited either by the grating size or by other structures deposited above or below the grating. One potential application would be measuring two-dimensionally periodic structures ("bigratings"). For example, FIG. 4 illustrates a bigrating 401 comprising rectangular grating cells (e.g. cells 402a, 402b, etc.) in a rectangular array. The focus spot 104 is confined to a single row of the array so that the grating pattern can be modeled as a simple one-dimensionally periodic structure within the illumination area.

Figure 1:
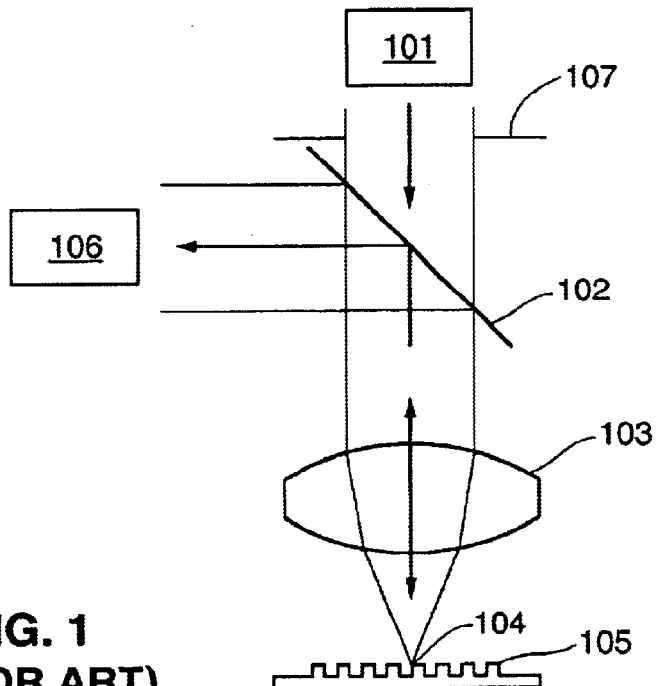
FIG. 1 is a side schematic view of an optical metrology instrument showing those elements that are common to both the prior art and the present invention.
Figure 2A:
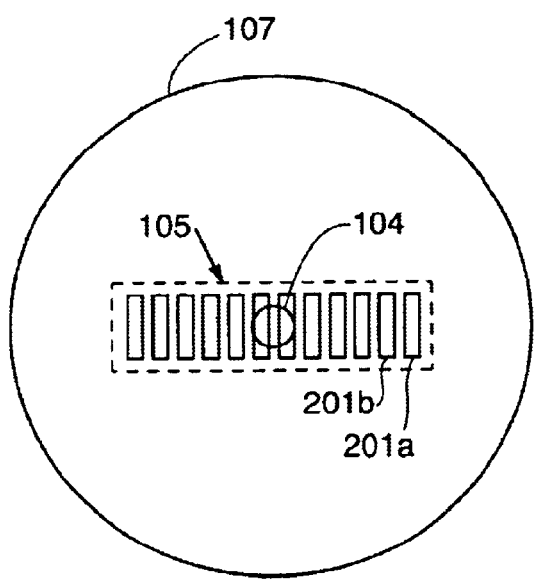
FIGS. 2a and 2b are top schematic views of a circular illumination spot produced over a diffractive feature of a sample by instruments like that in FIG. 1 with circular limiting apertures according to the prior art.
Figure 2B:
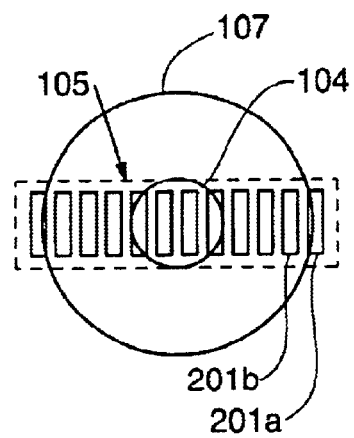
Figure 5:
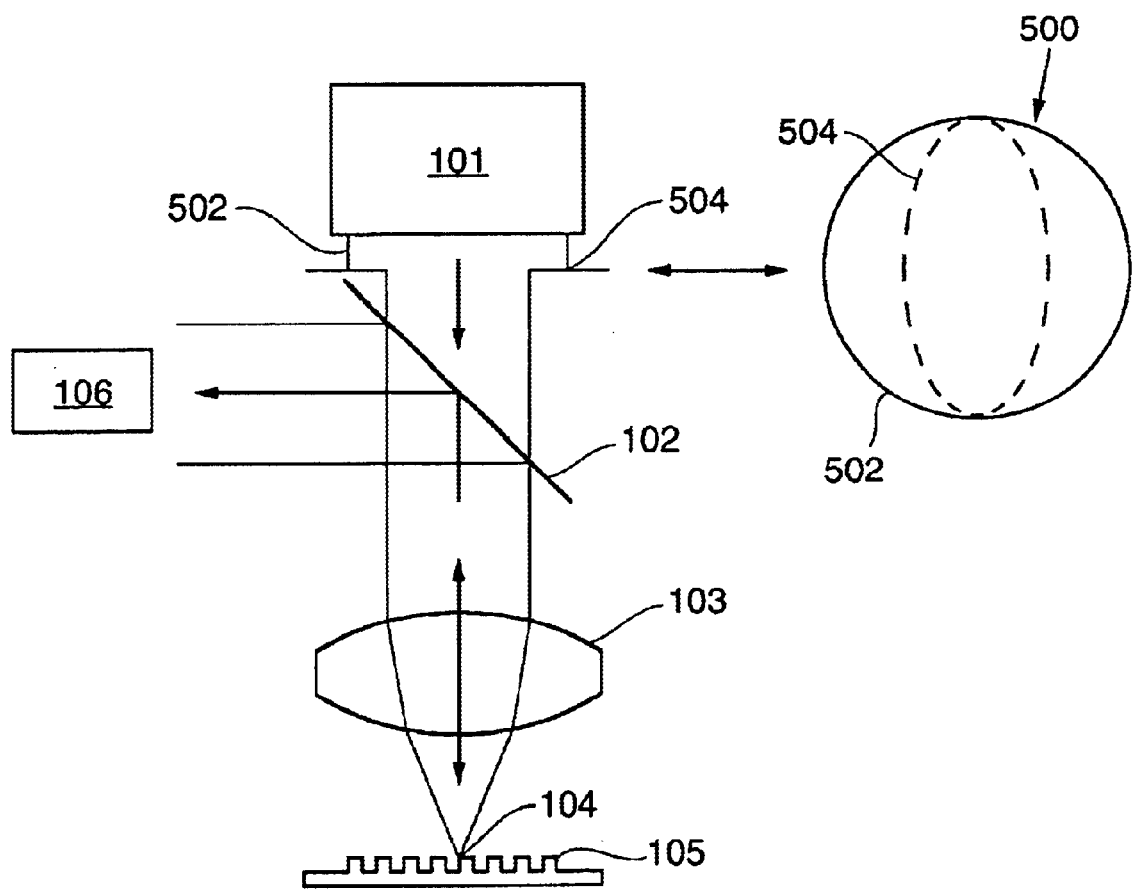
FIG. 5 is a side schematic view of an optical metrology instrument including an elongated aperture in accordance with the present invention.

FIG. 5 shows an elongated aperture 504 being used in an optical metrology instrument similar to that shown in FIG. 1. Reference numbers are carried over from FIG. 1 where appropriate. A light source 101 emits a light beam 502 having a particular shape in cross-section. The light beam is transmitted through a beam splitter 102, and is focused by an objective lens 103 onto a small focus spot 104 on a grating sample 105. Light reflected from the grating sample is redirected by the beam splitter 102 toward an optical detector 106. Reflectively data can be collected over a range of wavelengths to determine parameters such as line width and thickness. An elliptical cloned aperture 504 is used in this embodiment, positioned along the illumination path of the light beam 502. The elongated aperture functions to shape the beam, as shown in the cross-section 500 of FIG. 5. Cross-section 500 shows the elongated shape of the aperture 504 relative to a shape of the light beam 502 emitted from the source 101. After passing through the aperture 504, the transmitted portion of the beam also will have an elongated shape in cross-section. The transmitted portion of the beam then can be focused on the grating sample 105 by the objective lens 103 as a focus spot 104 having an elongated shape, similar to that of the elongated aperture. As shown and described with respect to FIG. 3, the elongated spot can extend over many grating lines, but can stay coined within the grating region.

What is claimed is:

1. A metrology instrument for samples containing grating-like microstructures comprised of a plurality of linear elements thereon, the instrument comprising:
   an illumination source directing light along an illumination path from the illumination source to the sample, the sample having at least one grating-like microstructure formed thereon, the sample producing a characteristic optical signature when illuminated,
   an elongated pupil aperture located in the illumination path,
   an objective focusing the light received from the aperture to the sample, the elongated pupil aperture and objective defining an elongated illumination spot on the sample, the elongated pupil aperture and elongated illumination spot having respective long directions which are perpendicular to each other, the measurement relation of the sample to the instrument being such that the long direction of the illumination spot is oriented generally transverse to linear elements of the microstructure,
   an optical detector located along a reflection path for detecting the optical signature produced from the illuminated sample.

2. The instrument of claim 1 wherein the optical signature comprises reflectivity data acquired over a range of wavelengths.

3. The instrument of claim 1 wherein the objective produces focused illumination with a narrow range of incidence angles in the direction generally transverse to the linear elements of the microstructure.

4. The instrument of claim 1 wherein the microstructure to be measured is a checkerboard-type bigrating structure, rows and columns of features defining linear elements of the microstructure, the elongated pupil aperture having a width dimension and the objective having focusing parameters selected such that the illumination spot has a narrow dimension corresponding to a width of a single row or column of the bigrating structure.

5. The instrument of claim 1, wherein the illumination spot is contained within the linear elements of the microstructure.

6. A metrology structure for analyzing a sample containing a plurality of linear microstructures positioned thereon, the structure comprising:
   a light source for illuminating the sample;
   a limiting aperture positioned along a beam path between the light source and the sample, the limiting aperture having an elongated shape such that a portion of light from the light source passing through the limiting aperture has an elongated beam shape; and
   an objective lens positioned along the beam path between the limiting aperture and the sample such that the portion of light having the elongated beam shape is focused on the sample as an elongated beam spot, an elongated spot axis of the elongated beam spot being perpendicular to an elongated aperture axis of the limiting aperture, the elongated spot being focused on the plurality of linear microstructures such that the elongated spot falls within the microstructures and the elongated spot axis is perpendicular to the plurality of linear microstructures.

7. A metrology structure according to claim 6, further comprising:
   an optical detector for detecting light reflected from the elongated beam spot on the plurality of linear microstructure.

8. A metrology structure according to claim 7, further comprising:
   a beam splitter positioned along the beam path allowing light to pass from the light source to the sample, and allowing light reflected from the elongated beam spot to be directed to the optical detector.

9. A metrology structure according to claim 6, wherein:
   the plurality of linear microstructures includes a plurality of rows of linear microstructures, and wherein the elongated beam spot is contained within one of said rows.

10. A metrology structure according to claim 6, wherein:
    the elongated shape of the limiting aperture is selected from the group consisting of elliptical and rectangular elongated shapes.

11. A metrology structure according to claim 6, wherein:
    the elongated shape of the limiting aperture is variable in at least one of size and shape.

12. A method for optically analyzing a sample containing a plurality of linear microstructures positioned thereon, the method comprising:
    directing a light beam along a beam path from a light source to the sample;
    shaping the light beam by passing the light beam through an elongated pupil aperture positioned along the beam path between the light source and sample; and
    focusing the shaped light beam on the sample as an elongated beam spot, the elongated beam spot being contained within the plurality of linear microstructures and having an elongated axis perpendicular to the orientation of the linear microstructures.

13. A method according to claim 12, further comprising:
    detecting the light beam reflected from the elongated beam spot on the sample.

14. A method according to claim 13, further comprising:
analyzing the reflected light beam in order to determine at least one of a line width, critical dimension, profile shape of at least one of the linear microstructures.

15. A method according to claim 12, further comprising:
detecting the light beam reflected from the elongated beam spot on the sample over a range of wavelengths.

16. A metrology structure for analyzing a sample containing a plurality of linear microstructures, the structure comprising:

a light source capable of illuminating the sample with a light beam;

a limiting aperture positioned along a beam path between the light source and the sample, the limiting aperture having an asymmetrical shape such that a range of light incidence of the light beam on the sample is limited in a direction substantially perpendicular to linear axes of the linear microstructures; and an objective lens positioned along the beam path between the limiting aperture and the sample such that the portion of light having the limited range is focused on the sample as an asymmetrical beam spot.

* * * * *